(12) United States Patent
Yanagisawa et al.

(10) Patent No.: US 12,317,731 B2
(45) Date of Patent: May 27, 2025

(54) DISPLAY DEVICE WITH DUMMY PIXEL LOCATED IN PERIPHERAL AREA

(71) Applicant: Japan Display Inc., Tokyo (JP)

(72) Inventors: Sho Yanagisawa, Tokyo (JP); Tetsuo Morita, Tokyo (JP); Kenji Harada, Tokyo (JP); Hiroshi Tabatake, Tokyo (JP); Hideyuki Takahashi, Tokyo (JP)

(73) Assignee: Japan Display Inc., Tokyo (JP)

( * ) Notice: Subject to any disclaimer, the term of this patent is extended or adjusted under 35 U.S.C. 154(b) by 863 days.

(21) Appl. No.: 17/455,042

(22) Filed: Nov. 16, 2021

(65) Prior Publication Data

US 2022/0157900 A1 May 19, 2022

(30) Foreign Application Priority Data

Nov. 17, 2020 (JP) .................... 2020-191068

(51) Int. Cl.
*H10K 59/88* (2023.01)
*H10K 59/122* (2023.01)
*H10K 59/131* (2023.01)

(52) U.S. Cl.
CPC .......... *H10K 59/88* (2023.02); *H10K 59/122* (2023.02); *H10K 59/131* (2023.02)

(58) Field of Classification Search
CPC ..... H10K 59/88; H10K 59/131; H10K 59/122
See application file for complete search history.

(56) References Cited

U.S. PATENT DOCUMENTS

| 8,044,582 B2* | 10/2011 | Takata ................. H10K 59/871 |
| | | 313/506 |
| 9,006,969 B2* | 4/2015 | Kim ....................... H10K 50/00 |
| | | 313/506 |
| 2004/0160170 A1 | 8/2004 | Sato et al. |
| 2008/0100209 A1 | 5/2008 | Ito |
| 2009/0009069 A1 | 1/2009 | Takata |
| 2009/0309489 A1 | 12/2009 | Takata et al. |

(Continued)

FOREIGN PATENT DOCUMENTS

| JP | 2000-195677 A | 7/2000 |
| JP | 2004-207217 A | 7/2004 |

(Continued)

OTHER PUBLICATIONS

Office Action issued on Aug. 6, 2024, in corresponding Japanese Application No. 2020-191068, 4 pages.

(Continued)

*Primary Examiner* — Lex H Malsawma
(74) *Attorney, Agent, or Firm* — Maier & Maier, PLLC

(57) ABSTRACT

According to one embodiment, a display device includes a base, a first insulating layer, a first pixel electrode on the first insulating layer in a pixel, a second pixel electrode on the first insulating layer in a dummy pixel, a second insulating layer on the first insulating layer, a first organic layer in the pixel and in contact with the first pixel electrode, a second organic layer in the dummy pixel, a partition wall on the second insulating layer and between the organic layers and a common electrode covering the organic layers and the partition wall. An end portion of the first organic layer is in contact with a side surface of the partition wall.

20 Claims, 12 Drawing Sheets

(56) References Cited

U.S. PATENT DOCUMENTS

| | | | |
|---|---|---|---|
| 2015/0060823 A1* | 3/2015 | Furuie | H10K 59/88 |
| | | | 257/40 |
| 2017/0352708 A1* | 12/2017 | Yamaguchi | H10K 50/15 |
| 2018/0315802 A1* | 11/2018 | Kamiyama | H10K 59/8722 |
| 2019/0165085 A1 | 5/2019 | Choi et al. | |
| 2019/0393284 A1 | 12/2019 | Li et al. | |
| 2019/0393445 A1 | 12/2019 | Lee et al. | |
| 2020/0013834 A1 | 1/2020 | Park et al. | |
| 2020/0208259 A1* | 7/2020 | Shin | C23C 16/042 |
| 2022/0157899 A1* | 5/2022 | Yanagisawa | H10K 59/88 |

FOREIGN PATENT DOCUMENTS

| | | |
|---|---|---|
| JP | 2008-047515 A | 2/2008 |
| JP | 2008-135325 A | 6/2008 |
| JP | 2009-032673 A | 2/2009 |
| JP | 2010-118191 A | 5/2010 |
| JP | 2012155987 A | 8/2012 |

OTHER PUBLICATIONS

Office Action issued on Mar. 25, 2024, in corresponding Chinese Application No. 202111352903.2, 17 pages.

* cited by examiner

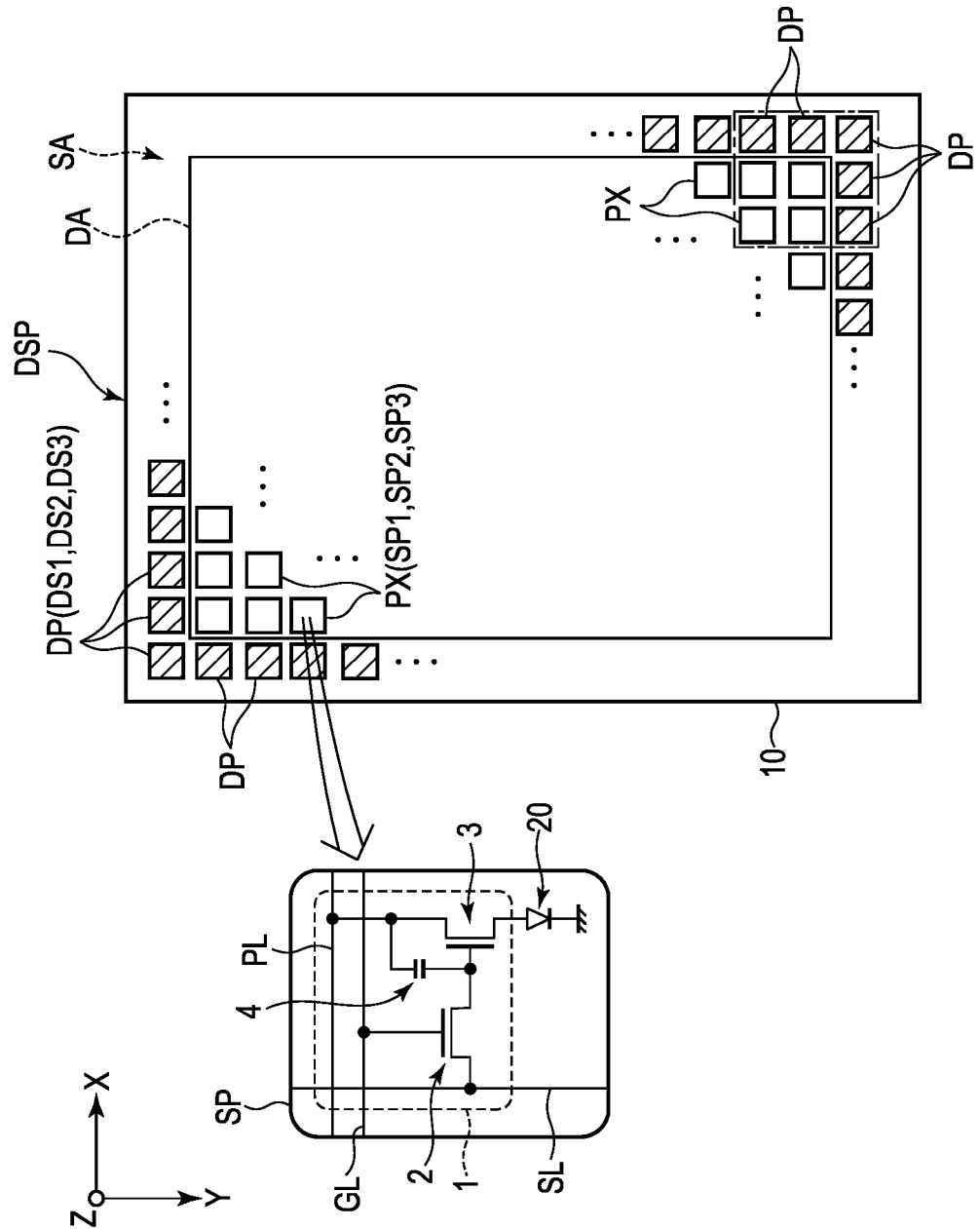
F I G. 1

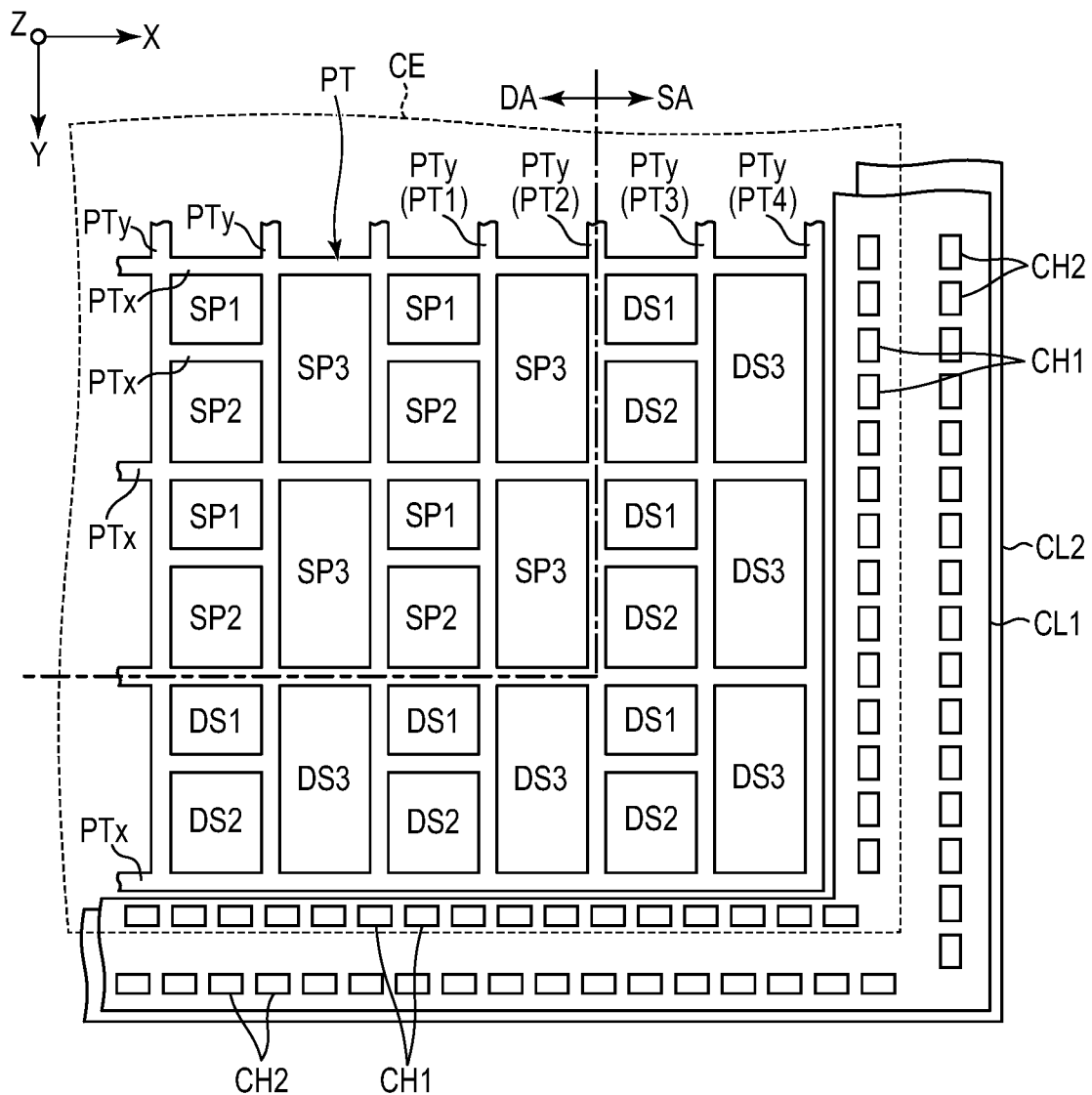
F I G. 7

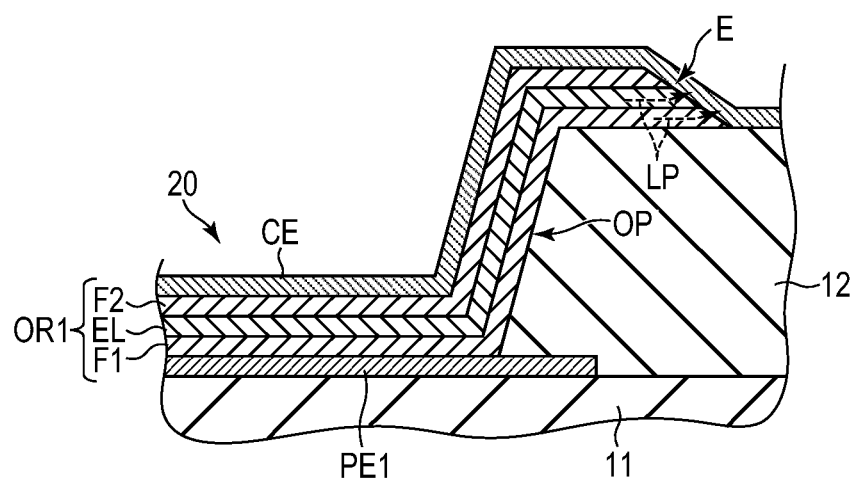
F I G. 8

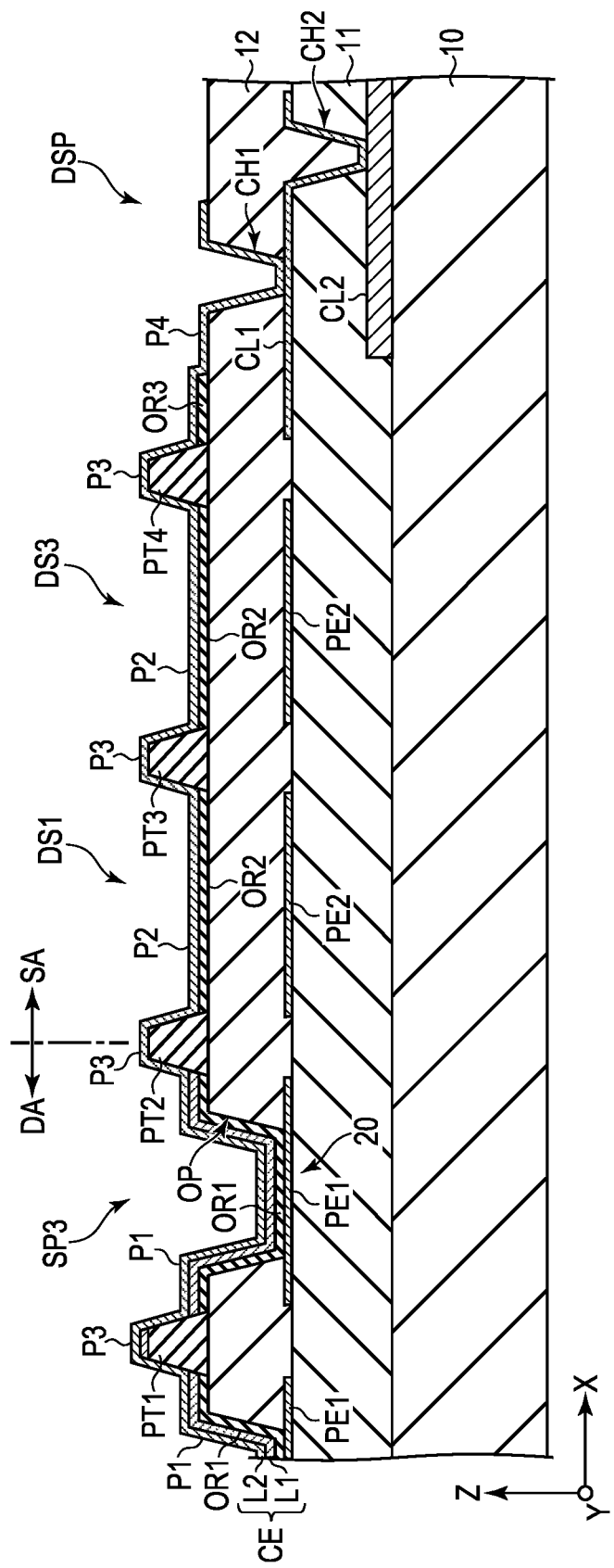
F I G. 11

DISPLAY DEVICE WITH DUMMY PIXEL LOCATED IN PERIPHERAL AREA

CROSS-REFERENCE TO RELATED APPLICATIONS

This application is based upon and claims the benefit of priority from Japanese Patent Application No. 2020-191068, filed Nov. 17, 2020, the entire contents of which are incorporated herein by reference.

FIELD

Embodiments described herein relate generally to a display device.

BACKGROUND

In recent years, display devices to which organic light-emitting diodes (OLEDs) are applied as display elements have been used in practical applications. Such a display device comprises a pixel electrode, a common electrode, and an organic layer disposed between the pixel electrode and the common electrode.

When patterning elements such as electrodes and wiring lines, which are repeatedly provided in the display area, the shape of the outermost one of these elements are, in some cases, not formed as designed. For example, when patterning pixel electrodes of pixels by etching, the outermost one of the pixel electrodes may be excessively eroded. If such a shape error occurs, the display quality of the display device is degraded.

BRIEF DESCRIPTION OF THE DRAWINGS

FIG. 1 is a diagram showing a configuration example of a display device according to the first embodiment.

FIG. 7 is a schematic plan view of partition walls, a common electrode and a conductive layer shown in FIG. 3.

FIG. 8 is a schematic cross-sectional view of a display device according to a comparative example.

FIG. 11 is a schematic cross-sectional view of still another example of the display device according to the second embodiment.

DETAILED DESCRIPTION

Figure 2:
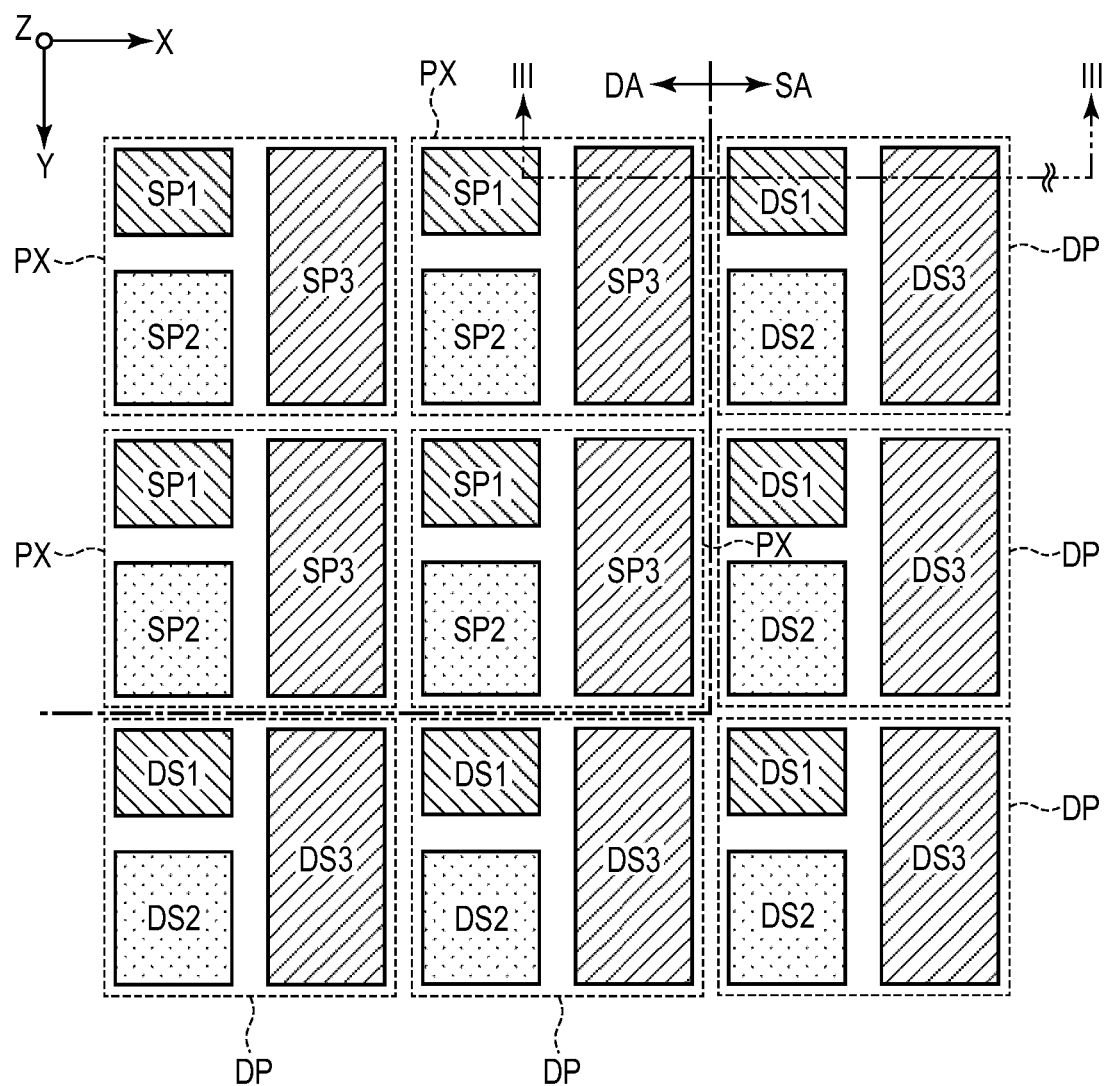
FIG. 2 is a diagram showing an example of layout of sub-pixels and dummy sub-pixels.

In general, according to one embodiment, a display device includes a base, a first insulating layer disposed on the base, a first pixel electrode disposed on the first insulating layer in a pixel located in a display area, a second pixel electrode disposed on the first insulating layer in a dummy pixel located in a peripheral area on an outer side of the display area, a second insulating layer disposed on the first insulating layer and comprising an opening overlapping the first pixel electrode, a first organic layer disposed in the pixel and in contact with the first pixel electrode via the opening, a second organic layer disposed in the dummy pixel, a partition wall disposed on the second insulating layer and between the first organic layer and the second organic layer and a common electrode covering the first organic layer, the second organic layer and the partition wall. An end portion of the first organic layer is in contact with a side surface of the partition wall.

According to such a configuration, a display device which can improve the display quality can be provided.

Embodiments will be described hereinafter with reference to the accompanying drawings.

Note that the disclosure is merely an example, and proper changes within the spirit of the invention, which are easily conceivable by a skilled person, are included in the scope of the invention as a matter of course. In addition, in some cases, in order to make the description clearer, the widths, thicknesses, shapes, etc., of the respective parts are schematically illustrated in the drawings, compared to the actual modes. However, the schematic illustration is merely an example, and adds no restrictions to the interpretation of the invention. Besides, in the specification and drawings, the same or similar elements as or to those described in connection with preceding drawings or those exhibiting similar functions are denoted by like reference numerals, and a detailed description thereof is omitted unless otherwise necessary.

Further, in order to make the descriptions more easily understandable, some of the drawings illustrate an X axis, a Y axis and a Z axis orthogonal to each other. A direction along the X axis is referred to as an X direction or a first direction, a direction along the Y axis is referred to as a Y direction or a second direction and direction along the Z axis is referred to as a Z direction or a third direction. A plane defined by the X axis and the Y axis is referred to as an X-Y plane, and a plane defined by the X axis and the Z axis is referred to as an X-Z plane. Here, viewing towards the X-Y plane is referred to as planar view.

Display devices DSP of the embodiments are each an organic electroluminescent display device comprising an organic light-emitting diode (OLED) as a display element, which is to be mounted on a TV, PC, in-vehicle device, mobile terminal, cell phone, etc.

First Embodiment

FIG. 1 shows a configuration example of a display device DSP according to the first embodiment. The display device DSP includes a display area DA which displays images and a peripheral area SA on an outer side of the display area DA, on an insulating base 10. The base 10 may be glass or a flexible resin film.

The display area DA comprises a plurality of pixels PX arranged in a matrix along the first direction X and the second direction Y. Each pixel PX comprises a plurality of sub-pixels SP. For example, the pixel PX comprises a red sub-pixel SP1, a green sub-pixel SP2, and a blue sub-pixel SP3. Note that, in addition to the three color sub-pixels, the pixel PX may include four or more sub-pixels of other colors, such as white and the like.

Each sub-pixel SP comprises a pixel circuit 1 and a display element 20 that is driven and controlled by the pixel circuit 1. The pixel circuit 1 comprises a pixel switch 2, a drive transistor 3 and a capacitor 4. The pixel switch 2 and the drive transistor 3 are switching elements each formed of for example, a thin-film transistor.

In the pixel switch 2, the gate electrode is connected to a respective scanning line GL, the source electrode is connected to a respective signal line SL, and the drain electrode is connected to one of the electrodes which constitute the capacitor 4 and the gate electrode of the drive transistor 3. In the drive transistor 3, the source electrode is connected to the other electrode of the capacitor 4 and a respective power line PL, and the drain electrode is connected to the anode of the display element 20. Note that the configuration of the pixel circuit 1 is not limited to that of the example illustrated in the figure.

The display element 20 is an organic light-emitting diode (OLED) as a light-emitting element. For example, a sub-pixel SP1 comprises a display element that emits light corresponding to a red wavelength, a sub-pixel SP2 comprises a display element that emits light corresponding to a green wavelength, and a sub-pixel SP3 comprises a display element that emits light corresponding to a blue wavelength. The configuration of the display elements 20 will be described later.

The peripheral area SA comprises a plurality of dummy pixels DP that do not display images. For example, the dummy pixels DP surrounds the display area DA. In other words, the dummy pixels DP are located between those pixels PX located on the outermost circumference and each side of the base 10.

The dummy pixels DP each comprise a plurality of dummy sub-pixels DS. For example, each dummy pixel DP comprises a dummy sub-pixel DS1 having a configuration similar to that of the sub-pixel SP1, a dummy sub-pixel DS2 having a configuration similar to that of the sub-pixel SP2, and a dummy sub-pixel DS3 having a configuration similar to that of the sub-pixel SP3.

FIG. 2 shows an example of the layout of the sub-pixels SP1, SP2 and SP3 and the dummy sub-pixels DS1, DS2 and DS3. Here, four pixels PX enclosed by a single-dotted frame and five dummy pixels DP located therearound as shown in FIG. 1 will be focused.

In each of the pixels PX, sub-pixels SP1 and SP2 are aligned along the second direction Y, sub-pixels SP1 and SP3 are aligned along the first direction X, and sub-pixels SP2 and SP3 are aligned along the first direction X. The sub-pixel SP1 is formed into substantially a rectangular shape extending along the first direction X. The sub-pixels SP2 and SP3 are each formed into substantially a rectangular shape extending along the second direction Y. The area of the sub-pixel SP2 is greater than the area of the sub-pixel SP1, and the area of the sub-pixel SP3 is greater than the area of the sub-pixel SP2. Note that the area of the sub-pixel SP1 may be the same as that of the sub-pixel SP2.

Now, let us focus on those pixels PX arranged in the display area DA, the sub-pixels SP1 and the sub-pixels SP3 are alternately aligned along the first direction X. The sub-pixels SP2 and the sub-pixels SP3 are also alternately aligned along the first direction X. The sub-pixels SP1 and the sub-pixels SP2 are alternately aligned along the second direction Y. The sub-pixels SP3 are aligned along the second direction Y without interposing the sub-pixels SP1 and SP2.

The dummy sub-pixels DS1 have the same shape as that of the sub-pixels SP1, the dummy sub-pixels DS2 have the same shape as that of the sub-pixels SP2, and the dummy sub-pixels DS3 have the same shape as that of the sub-pixels SP3. The arrangement of the dummy sub-pixels DS1, DS2 and DS3 in each dummy pixel DP is the same as that of the sub-pixels SP1, SP2 and SP3 in each pixel PX. The shape and arrangement of the dummy sub-pixels DS1, DS2 and DS3 may be different from the shape and arrangement of the sub-pixels SP1, SP2 and SP3.

Note that the outlines of the sub-pixels SP1, SP2 and SP3 and the dummy sub-pixels DS1, DS2 and DS3 shown in FIG. 2 correspond to the outlines of the pixel electrodes or the light-emitting area of the display device, but they are shown in a simplified form and do not necessarily reflect the actual shape.

Figure 3:
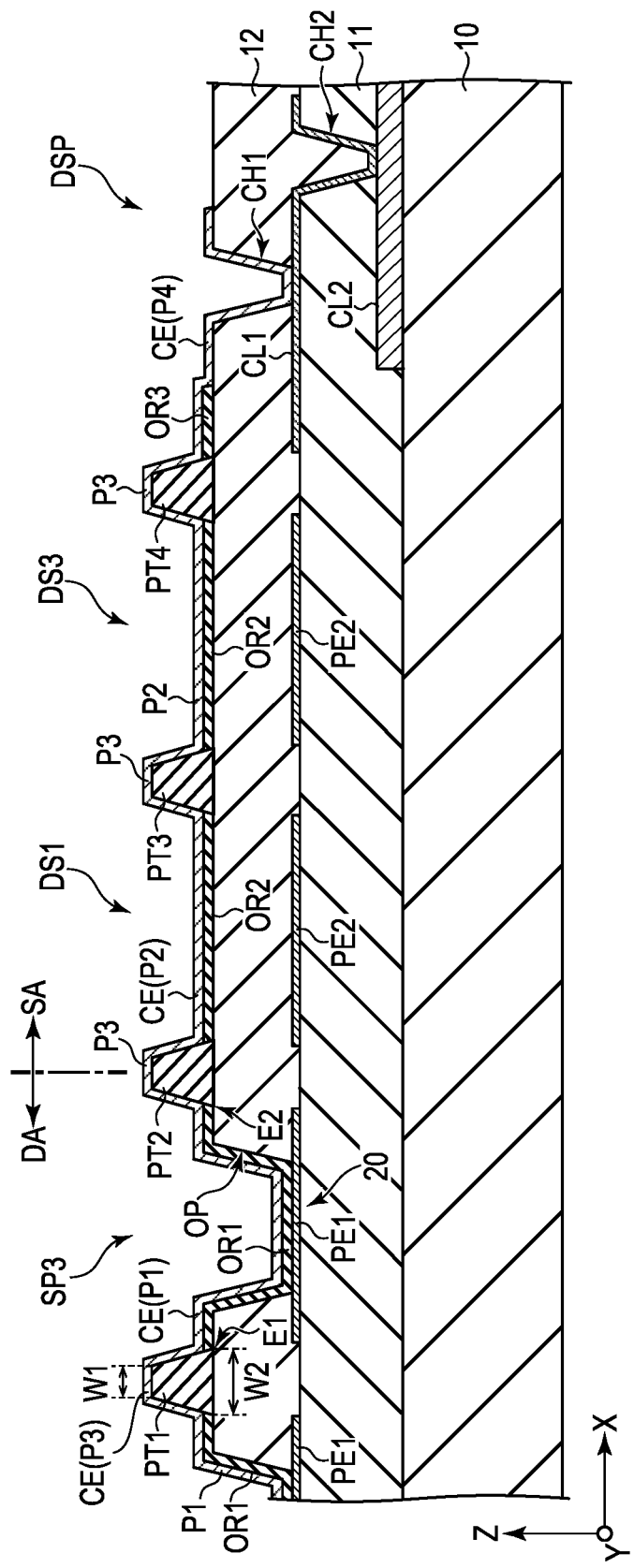
FIG. 3 is a schematic cross-sectional view of the display device taken along line in FIG. 2.

FIG. 3 is a schematic cross-sectional view of the display device DSP taken along line in FIG. 2. The display device DSP comprises an insulating layer 11 (first insulating layer) disposed on the base 10 and an insulating layer 12 (second insulating layer) disposed on the insulating layer 11. The pixel circuit 1 and other components shown in FIG. 1 are disposed on the base 10 and covered by the insulating layer 11, illustration of which is omitted. The insulating layers 11 and 12 are, for example, organic insulating layers. The insulating layer 11 may be referred to as an underlayer of the display element 20. The insulating layer 12 is formed to partition the display element 20 or the sub-pixel SP, and may be referred to as ribs or partition walls.

As in the sub-pixel SP3 shown in FIG. 3, the display element 20 of each sub-pixel SP comprises a pixel electrode PE1 (first pixel electrode), an organic layer OR1 (first organic layer) and a common electrode CE. The pixel electrode PE1 is an electrode provided for each sub-pixel SP or each display element 20, and may be referred to as an upper electrode or anode. The common electrode CE is an electrode commonly provided for a plurality of sub-pixels SP or a plurality of display elements 20, and may be referred to as a counter electrode, upper electrode or cathode.

The pixel electrode PE1 is disposed on the insulating layer 11, and its peripheral portion is covered by the insulating layer 12. The pixel electrode PE1 is electrically connected to the drive transistor 3 shown in FIG. 1. The pixel electrode PE1 is a transparent electrode formed of, for example, a transparent conductive material such as indium tin oxide (ITO) or indium zinc oxide (IZO). Note that the pixel electrode PE1 may also be a metal electrode formed of a metal material such as silver, aluminum or the like. Further, the pixel electrode PE1 may be of a stacked body of transparent electrode and metal electrode. For example, the pixel electrode PE1 may be configured as a stacked body in which a transparent electrode, a metal electrode and a transparent electrode are stacked in this order, or may be configured as a stacked body of three or more layers.

The insulating layer 12 comprises an opening OP superimposed on the pixel electrode PE1 in each sub-pixel SP. The organic layer OR1 is disposed on the insulating layer 12 and is in contact with the pixel electrode PE1 through the opening OP.

Figure 4:
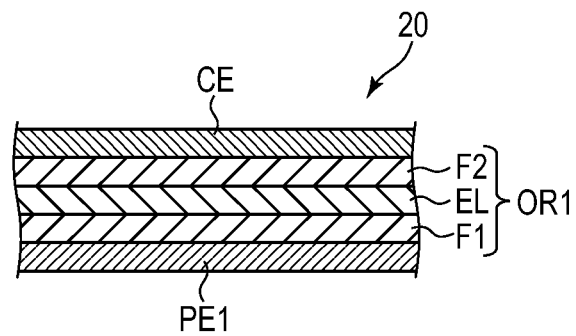
FIG. 4 is a cross-sectional view showing an example of a layer configuration that can be applied to an organic layer.

FIG. 4 is a cross-sectional view showing an example of a layer configuration that can be applied to the organic layer OR1. For example, the organic layer OR1 includes a functional layer F1 (first functional layer), a light-emitting layer EL and a functional layer F2 (second functional layer), which are stacked in order from the pixel electrode PE1 towards the common electrode CE. The functional layers F1 and F2 each are, for example, a hole injection layer, a hole transport layer, a hole blocking layer, an electron injection layer, an electron transport layer or an electron blocking layer, but may be other functional layers. Each of the functional layers F1 and F2 is not limited to a single layer, but as well be a stacked body in which multiple functional layers are stacked on one another. Further, at least one of the functional layers F1 and F2 may be omitted.

As shown in FIGS. 3 and 4, the common electrode CE covers the organic layer OR1. The common electrode CE is a transparent electrode formed of, for example, a transparent conductive material such as ITO or IZO. The common electrode CE may be covered by a transparent protective film (including at least one of an inorganic insulating film and an organic insulating film).

When the potential of the pixel electrode PE1 is relatively higher than that of the common electrode CE, the pixel electrode PE1 corresponds to the anode and the common electrode CE corresponds to the cathode. On the other hand, when the potential of the common electrode CE is relatively higher than that of the pixel electrode PE1, the common electrode CE corresponds to the anode and the pixel electrode PE1 corresponds to the cathode.

For example, when the pixel electrode PE1 corresponds to the anode, the functional layer F1 includes at least one of the hole injection layer and the hole transport layer, and the functional layer F2 includes at least one of the electron transport layer and the electron injection layer.

As in the dummy sub-pixels DS1 and DS3 shown in FIG. 3, the dummy sub-pixels DS each include a pixel electrode PE2 (second pixel electrode) and an organic layer OR2 (second organic layer). As in the case of the pixel electrode PE1, the pixel electrode PE2 is disposed on the insulating layer 11 and is covered by the insulating layer 12. The pixel electrode PE2 is formed by the same process and of the same material as those of the pixel electrode PE1. As in the case of the organic layer OR1, the organic layer OR2 is disposed on the insulating layer 12 and is covered by the common electrode CE. The organic layer OR2 has the same structure as that of the organic layer OR1, and for example, it contains the light-emitting layer EL and the functional layers F1 and F2.

In the example illustrated in FIG. 3, the insulating layer 12 does not comprise an opening in the dummy sub-pixels DS. Therefore the pixel electrode PE2 and the organic layer OR2 of each dummy sub-pixel DS oppose each other via the insulating layer 12. In the dummy sub-pixels DS with such a configuration, even if a potential difference is created between the pixel electrode PE2 and the common electrode CE, the organic layer OR2 does not emit light.

The dummy sub-pixels DS may comprise a pixel circuit 1 similar to that of the sub-pixels SP. This pixel circuit 1 may or may not be connected to the pixel electrode PE2. When the dummy sub-pixel DS comprises the pixel circuit 1, this pixel circuit 1 can protect the pixel circuit 1 of the sub-pixel SP from electrostatic discharge which may be generated in the manufacturing process of the display device DSP, etc.

Between the organic layers OR1 disposed respectively on two adjacent sub-pixels SP, between the organic layer OR1 disposed on a sub-pixels SP and the organic layer OR2 disposed on a dummy sub-pixel DS adjacent to this sub-pixels SP and between the organic layers OR2 disposed respectively on two adjacent dummy sub-pixels DS, partition walls PT are respectively provided. In the example illustrated in FIG. 3, a dummy sub-pixel is placed between two dummy sub-pixels. In the example shown in FIG. 3, a partition wall PT is placed on a right side of the dummy sub-pixel DS3 as well. The partition walls PT each are, for example, an organic insulating layer.

In the following descriptions, the four partition walls PT shown in FIG. 3 may be referred to respectively as a partition wall PT1 (first partition wall), a partition wall PT2 (second partition wall), a partition wall PT3 (third partition wall) and a partition wall PT4 (fourth partition wall) in order from left to right. The partition walls PT1, PT2, PT3 and PT4 are disposed on the insulating layer 12.

Each partition wall PT has a forward tapered shape. The forward tapered shape means such a shape as shown in the partition wall PT1 shown in FIG. 3 that a width W1 of an upper portion is less than a width W2 of a lower portion. Each side surface of the partition walls PT may be a plane inclined to the third direction Z, or it may be a curved surface. The partition wall PT may be configured to include a plurality of portions whose widths decrease in steps from the lower portion toward the upper portion.

The organic layer OR1 of the sub-pixel SP3 is located between the partition wall PT1 and the partition wall PT2. The organic layer OR2 of the dummy sub-pixel DS1 is located between the partition wall PT2 and the partition wall PT3. The organic layer OR2 of the dummy sub-pixel DS3 is located between the partition wall PT3 and the partition wall PT4.

The common electrode CE continuously covers the organic layers OR1, OR2 and the partition walls PT1, PT2, PT3 and PT4. The common electrode CE is formed entirely over the area including the sub-pixels SP and dummy sub-pixels DS, for example, by vapor deposition. In the following descriptions, the portion of the common electrode CE, which covers the organic layer OR1 may be referred to as the first portion P1, the portion which covers the organic layer OR2 as the second portion P2, the portion which covers the upper portion of the partition wall PT as the third portion P3, and the portion located on an outer side of the partition wall PT (partition wall PT4), which is located at an outermost end may be referred to as the fourth portion P4. In this embodiment, the first portion P1, the second portion P2, the third portion P3 and the fourth portion P4 are connected together.

The display device DSP further comprises a conductive layer CL1 (first conductive layer) disposed between the insulating layers 11 and 12, and a conductive layer CL2 (second conductive layer) disposed between the base 10 and the insulating layer 11. In the peripheral area SA, the insulating layer 12 comprises a contact hole CH1 (first contact hole) and the insulating layer 11 comprises a contact hole CH2 (second contact hole). For example, the conductive layer CL1 is formed by the same process and of the same material as those of the pixel electrodes PE1 and PE2.

The fourth portion P4 of the common electrode CE is in contact with the conductive layer CL1 via the contact hole CH1. The conductive layer CL1 is in contact with the conductive layer CL2 via the contact hole CH2. A common voltage is supplied to the conductive layer CL2. The common voltage is supplied to the entire common electrode CE via the conductive layer CL1.

In the example shown in FIG. 3, an organic layer OR3 (third organic layer) is disposed between the partition wall PT4 and the contact hole CH1. The organic layer OR3 is disposed on the insulating layer 12 and covered by the fourth portion P4. For example, in the organic layers OR1 and OR2, the light-emitting layers EL are each formed separately for the respective color of the sub-pixel SP and dummy sub-pixel DS. On the other hand, at least some of the layers contained in the functional layers F1 and F2 described above are formed at the same time entirely for the area including the sub-pixels SP and the dummy sub-pixels DS. For example, the organic layer OR3 is a part where the layer (common layer) formed at the same time for each sub-pixel SP and each dummy sub-pixel DS as just mentioned, is divided by the partition wall PT4. In this case, the organic layer OR3 may not necessarily contain the light-emitting layer EL.

The organic layer OR1 of the sub-pixel SP3 includes a first end portion E1 on a side of the partition wall PT1 and a second end portion E2 on a side of the partition wall PT2. The first end portion E1 and the second end portion E2 are located above the insulating layer 12.

Figure 5:
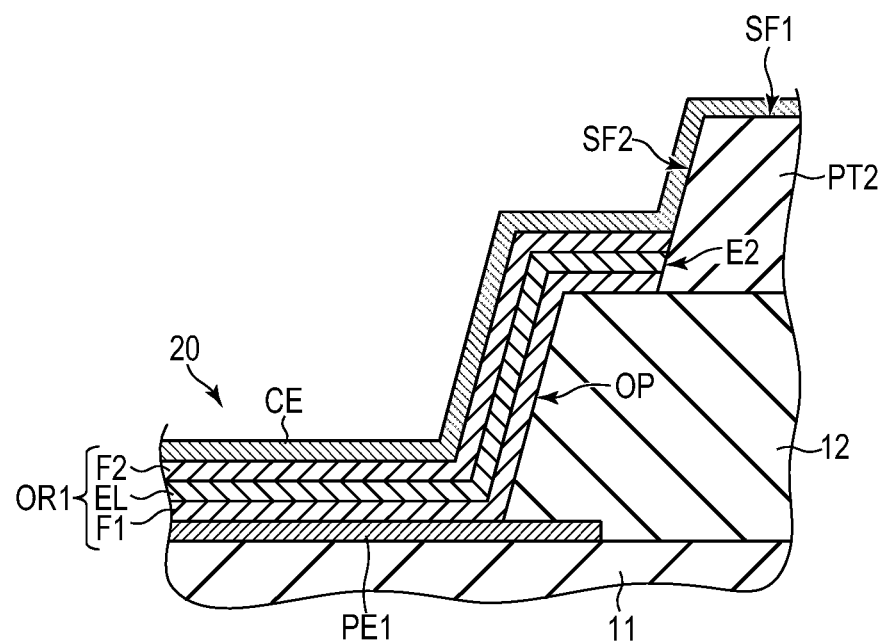
FIG. 5 is an enlarged cross-sectional view schematically showing the vicinity of an end portion of the organic layer.

FIG. 5 is an enlarged schematic cross-sectional view showing the vicinity of the second end portion E2. The partition wall PT2 includes an upper surface SF1 and a side surface SF2. The second end portion E2 is in contact with the side surface SF2.

In the example shown in FIG. 5, end portions of the light-emitting layer EL and the functional layers F1 and F2 are in contact with the side surface SF2. The common electrode CE continuously covers the functional layer F2, the side surface SF2 and the upper surface SF1. The common electrode CE is not in contact with the light-emitting layer EL and the functional layer F1.

Note that at least part of the layers which constitute the organic layer OR1 may be disposed on the upper surface SF1 while the part being separated from the second end portion E2. For example, when the light-emitting layer EL and the functional layers F1 and F2 are formed in the area overlapping the partition wall PT2, part of the light-emitting layer EL and the functional layers F1 and F2 can be placed between the upper surface SF1 and the common electrode CE. If the inclination of the side surface SF2 is steep, such part is divided from the light-emitting layer EL and the functional layers F1 and F2 formed near the partition wall PT2.

The relationship between the first end portion E1 and the partition wall PT1 is similar to the relationship between the second end portion E2 and the partition wall PT2. In other words, the first end portion E1 is in contact with a side surface of the partition wall PT1. Further, both end portions of the organic layer OR2 of the dummy sub-pixel DS1 shown in FIG. 3 are in contact with the respective side surfaces of the partition walls PT2 and PT3 and both end portions of the organic layer OR2 of the dummy sub-pixel DS3 are in contact with the respective side surfaces of the partition walls PT3 and PT4.

Figure 6:
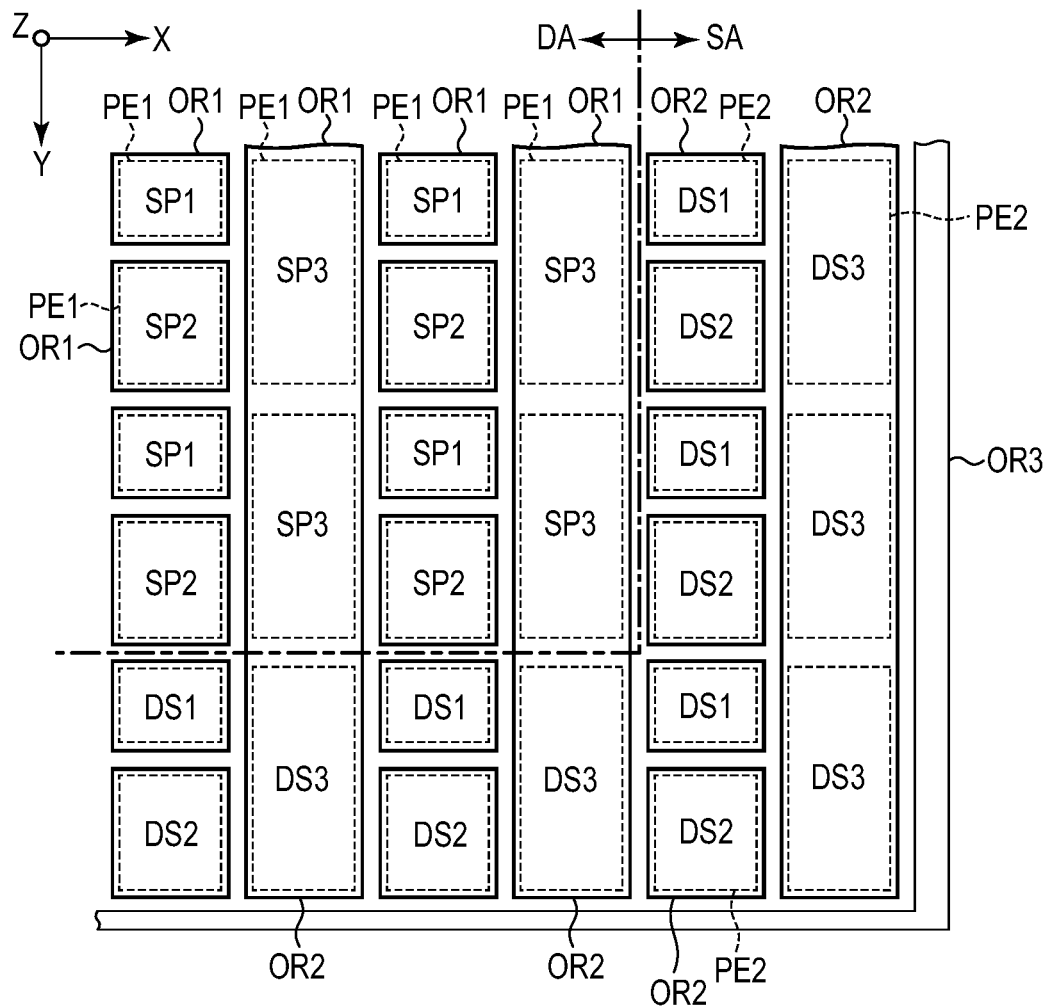
FIG. 6 is a schematic plan view of pixel electrodes and the organic layer shown in FIG. 3.

FIG. 6 is a schematic plan view of the pixel electrodes PE1, PE2 and the organic layers OR1, OR2 and OR3. The pixel electrodes PE1 are spaced apart from each of the sub-pixels SP1, SP2 and SP3. The pixel electrodes PE1 overlap the above-described openings OP, respectively. The pixel electrodes PE2 are spaced apart from each of the dummy sub-pixels DS1, DS2 and DS3.

The organic layers OR1 overlaps the pixel electrodes PE1 respectively in the sub-pixels SP1, SP2 and SP3. In the example shown in FIG. 6, a continuous organic layer OR1 is provided for a plurality of sub-pixels SP3 aligned along the second direction Y.

The organic layers OR2 overlap the pixel electrodes PE2, respectively, in the dummy sub-pixels DS1, DS2 and DS3. In the example shown in FIG. 6, a continuous organic layer OR2 is provided for a plurality of dummy sub-pixels DS3 aligned along the second direction Y. The organic layer OR2 of the dummy sub-pixel DS3 located adjacent to a sub-pixel SP3 along the second direction Y is connected to the organic layer OR1 of the sub-pixel SP3.

The organic layer OR3 includes a portion extending along the first direction X and a portion extending along the second direction Y. For example, the organic layer OR3 is formed in a ring shape in the peripheral area SA. The dummy sub-pixels DS1, DS2 and DS3 are located between the display area DA and the organic layer OR3.

FIG. 7 is a schematic plan view of the partition walls PT, a common electrode CE and conductive layers CL1 and CL2. The partition walls PT includes partition walls PTx extending along the first direction X and partition walls PTy extending along the second direction Y. The partition walls PT1, PT2, PT3 and PT4 shown in FIG. 3 are all partition walls PTy.

The partition walls PTx and PTy are disposed between two adjacent sub-pixels SP, between two adjacent dummy sub-pixels DS and between adjacent pairs of respective sub-pixels SP and respective dummy sub-pixels DS, and are formed into a grid pattern as a whole. Note that the partition walls PTx may not be provided between two sub-pixels SP3 aligned along the second direction Y, between two dummy sub-pixels DS3 aligned along the second direction Y, and between adjacent pairs of respective sub-pixels SP3 and respective dummy sub-pixels DS3 aligned along the second direction Y.

For example, the conductive layers CL1 and CL2 are formed into a ring shape in the peripheral area SA. The dummy sub-pixels DS1, DS2 and DS3 are located between the display area DA and the conductive layers CL1 and CL2.

In the example shown in FIG. 7, a large number of contact holes CH1 and CH2 are formed around the dummy sub-pixels DS1, DS2 and DS3. The contact holes CH1 are located closer to the side of the display area DA than the contact holes CH2. As another example, the contact holes CH1 may have an elongated shape in which a plurality of contact holes CH1 aligned along the first direction X or those aligned along the second direction Y in FIG. 7 are connected together into one. Similarly, the contact holes CH2 may have an elongated shape in which a plurality of contact holes CH2 aligned along the first direction X or those aligned along the second direction Y in FIG. 7 are connected together into one.

As indicated by the dashed lines in FIG. 7, the common electrode CE is disposed in the area including the sub-pixels SP1, SP2 and SP3 and the dummy sub-pixels DS1, DS2 and DS3. An edge of the common electrode CE is located between the contact holes CH1 and CH2.

FIG. 3 shows the cross-sectional structure of the sub-pixels SP3 and the dummy sub-pixels DS1 and DS3 along the first direction X. The cross-sectional structure of the sub-pixels SP1 and SP2 along the first direction X is also similar to that of the sub-pixel SP3, and the cross-sectional structure of the dummy sub-pixel DS2 along the first direction X is also similar to that of the dummy sub-pixel DS1. Further, the cross-sectional structure of the sub-pixels SP1, SP2, and SP3 along the second direction Y is similar to that of the sub-pixel SP3 in FIG. 3, and the cross-sectional structure of the dummy sub-pixels DS1, DS2, and DS3 along the second direction Y is similar to that of the dummy sub-pixels DS1 and DS3 in FIG. 3.

Of the elements disposed in the sub-pixels SP in the display area DA, for example, the pixel electrodes PE1 are patterned by etching. When multiple elements are formed at the same time by etching, the outermost circumferential ones of these elements may be excessively eroded. Therefore, if there is no conductive layer similar to the pixel electrodes PE1 on an outer side of the outermost pixel electrodes PE1 in the display area DA, the pixels PX including the outermost pixel electrodes PE1 cannot be formed to have a configuration as designed, and the display quality may be degraded.

In contrast, in this embodiment, the dummy pixels DP including the pixel electrodes PE2 are disposed on an outer side of the outermost pixels PX in the display area DA. With this structure, excessive erosion of the pixel electrodes PE1 of the outermost pixels PX does not easily occur, and as a result, the display quality of the display device DSP can be improved.

Further, in this embodiment, the partition walls PT are placed at boundaries of the sub-pixels SP and dummy sub-pixels SP, and the end portions of the organic layers OR1 are respectively brought into contact with the side surfaces of the partition walls PT. One of the advantageous effects of this configuration will be explained below.

FIG. 8 is a schematic cross-sectional view of a display device of a comparative example with respect to this embodiment, showing the vicinity of the end portion E of the organic layer OR1 as in FIG. 5. The comparative example is different from the structure in FIG. 5 in that partition walls PT are not provided. The second end portion E2 is located above the insulating layer 12 and is covered by the common electrode CE.

In the comparative example, the light-emitting layer EL and the functional layer F1 are in contact with the common electrode CE at the end portion E. Therefore, unlike the original current path through the functional layer F1, the light-emitting layer EL and the functional layer F2, a leak path LP is formed that directly connects the functional layer F1 and the light-emitting layer EL to the common electrode CE. The leak path LP thus formed can cause a degradation in display quality and an increase in power consumption.

In particular, when a single mask is used to form each layer of the organic layer OR1, the material of each layer is also deposited at an edges of the opening of the mask; therefore the later the layer is formed, the slightly smaller, the size becomes. Thus, as shown in FIG. 8, the end portion E is inclined and the contact area between each layer of the organic layer OR1 and the common electrode CE increases, which makes the formation of the leak path LP easy.

In contrast, when the end portion of the organic layer OR1 is in contact with the side surface of each partition wall PT as in this embodiment, the light-emitting layer EL and the functional layer F1 are not easily exposed from the functional layer F2. Therefore, the formation of the leakage path is suppressed, which makes it possible to improve the display quality of the display device DSP and to reduce the power consumption.

Apart from the above, various other advantageous effects can be obtained from this embodiment.

Second Embodiment

The second embodiment will now be described. Note that the configuration not specifically referred to here is similar to that of the first embodiment.

Figure 9:
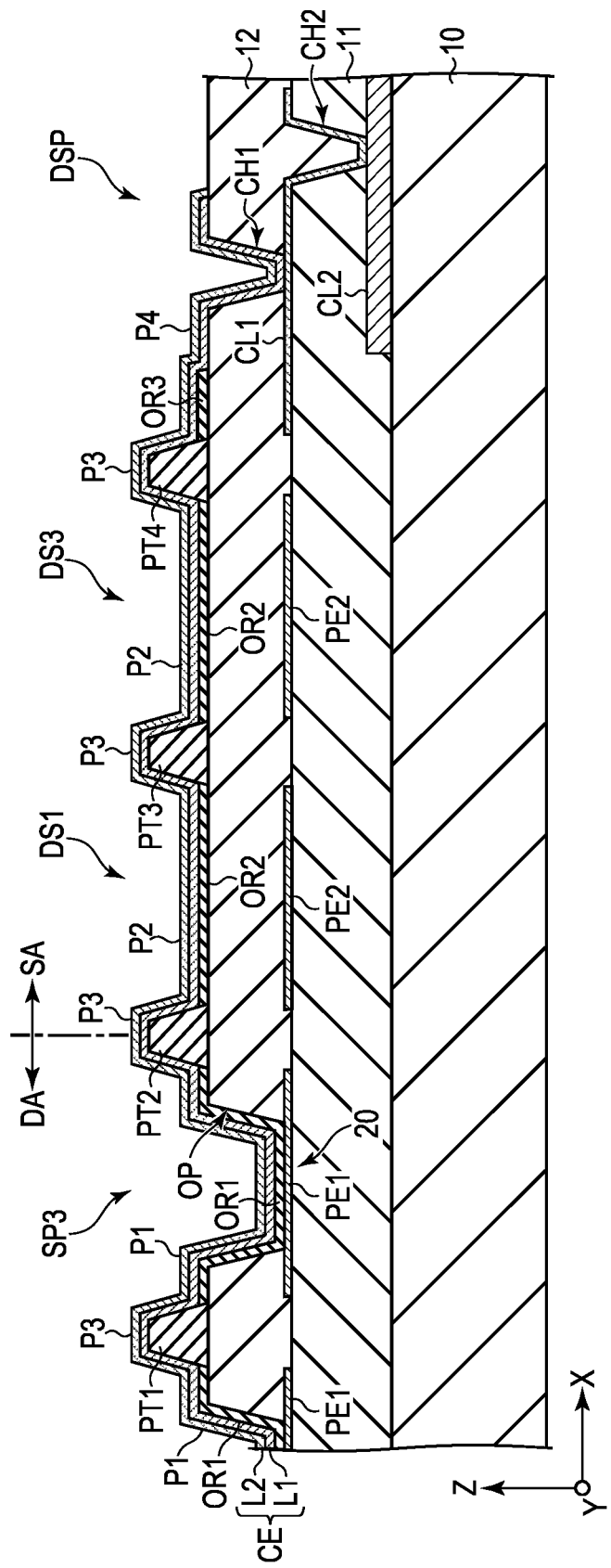
FIG. 9 is a schematic cross-sectional view of an example of a display device according to the second embodiment.
Figure 10:
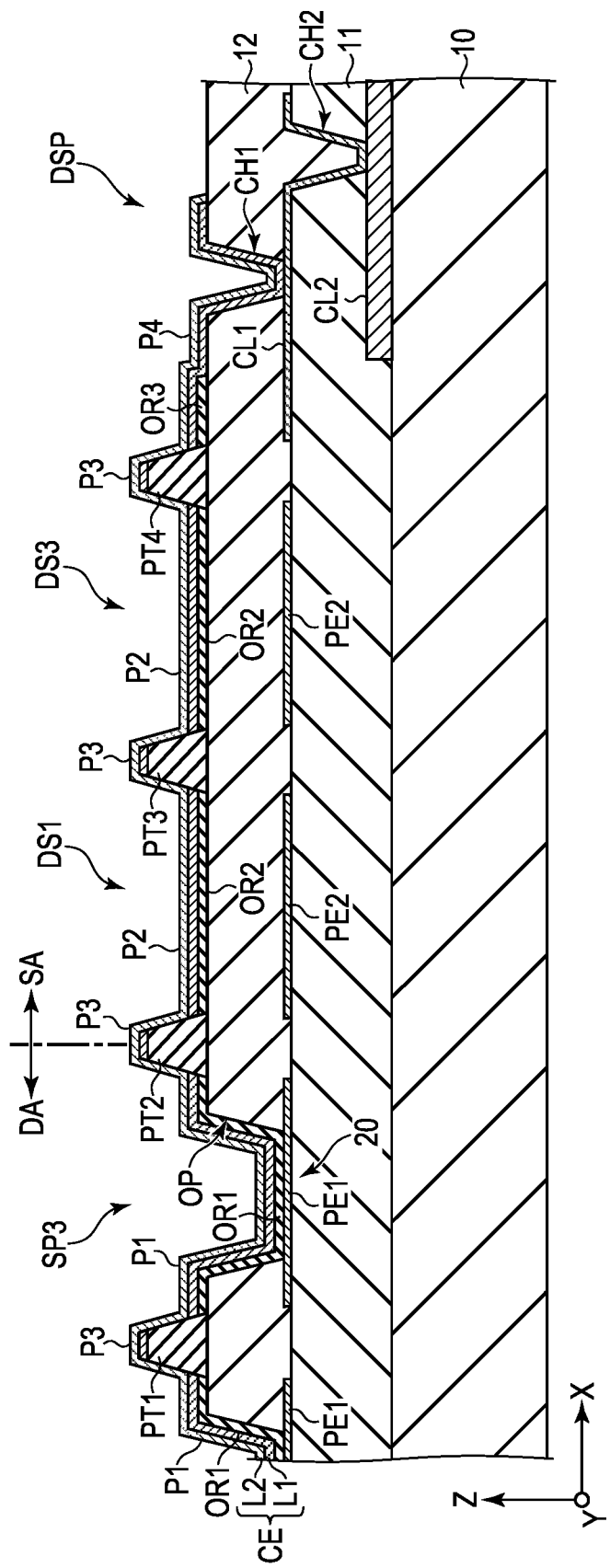
FIG. 10 is a schematic cross-sectional view of another example of the display device according to the second embodiment.

FIG. 9 is a schematic cross-sectional view of an example of a display device DSP of this embodiment. FIG. 10 is a schematic cross-sectional view of another example of the display device DSP according to this embodiment. In these figures, the common electrode CE comprises a first layer L1 and a second layer L2. The first layer L1 and the second layer L2 are formed of, for example, a transparent conductive material such as ITO or IZO.

The first layer L1 covers organic layers OR1, OR2, OR3, partition walls PT1, PT2, PT3, PT4 and an insulating layer 12 around a contact hole CH1. The second layer L2 covers the first layer L1. In this embodiment, a first portion P1, a second portion P2, a third portion P3 and a fourth portion P4 of the common electrode CE each include the first layer L1 and the second layer L2.

In the example shown in FIG. 9, the first layer L1 in the first portion P1, the second portion P2, the third portion P3 and the fourth portion P4 are continuously connected. Further, the second layer L2 is continuously provided in the first portion P1, the second portion P2, the third portion P3 and the fourth portion P4.

In the example shown in FIG. 10, the first layer L1 in the first portion P1 is separated from the first layer L1 in the third portion P3, the first layer L1 in the second portion P2 is separated from the first layer L1 in the third portion P3, and the first layer L1 in the fourth portion P4 is separated from the first layer L1 in the third portion P3. On the other hand, the second layer L2 is continuously provided in the first portion P1, second portion P2, third portion P3 and fourth portion P4.

When the common electrode CE is thin, there is a possibility that the common electrode CE may break due to the steps formed by the partition wall PT and the opening OP as in the case of the first layer L1 in FIG. 10. On the other hand, due to limitations of the manufacturing equipment, it may not be possible to make the transparent conductive layer, which is a single layer, sufficiently thick. However, as in this embodiment, when the common electrode CE is formed of two layers, the continuity of the entire common electrode CE can be maintained just in case where one layer is broken as in the example shown in FIG. 10 by the other layer connected.

FIG. 11 is a schematic cross-sectional view of still another example of the display device DSP of this embodiment. In the example illustrated in this figure, the first layer L1 is formed in the display area DA, but not in the peripheral area SA. The second layer L2 is formed in both the display area DA and the peripheral area SA.

With this configuration, the first portion P1 and the third portion P3 above the partition wall PT1 include both the first layer L1 and the second layer L2, but the second portion P2, the fourth portion P4 and the third portion P3 above the partition walls PT2, PT3 and PT4 contain the second layer L2 and do not contain the first layer L1. In this configuration, the thickness of the first portion P1 is greater than the thickness of the second portion P2.

When no opening OP is provided in the dummy sub-pixel DS, there are fewer stepped portions in the peripheral area SA, which makes the common electrode CE less breakable. Therefore, even in a configuration where the common electrode CE is multilayered in the display area DA and not multilayered in the peripheral area SA as in the example shown in FIG. 11, a sufficient effect of improving the conductivity of the common electrode CE can be obtained.

Third Embodiment

The third embodiment will now be described. The configuration that is not specifically referred to here is similar to that of the first embodiment.

Figure 12:
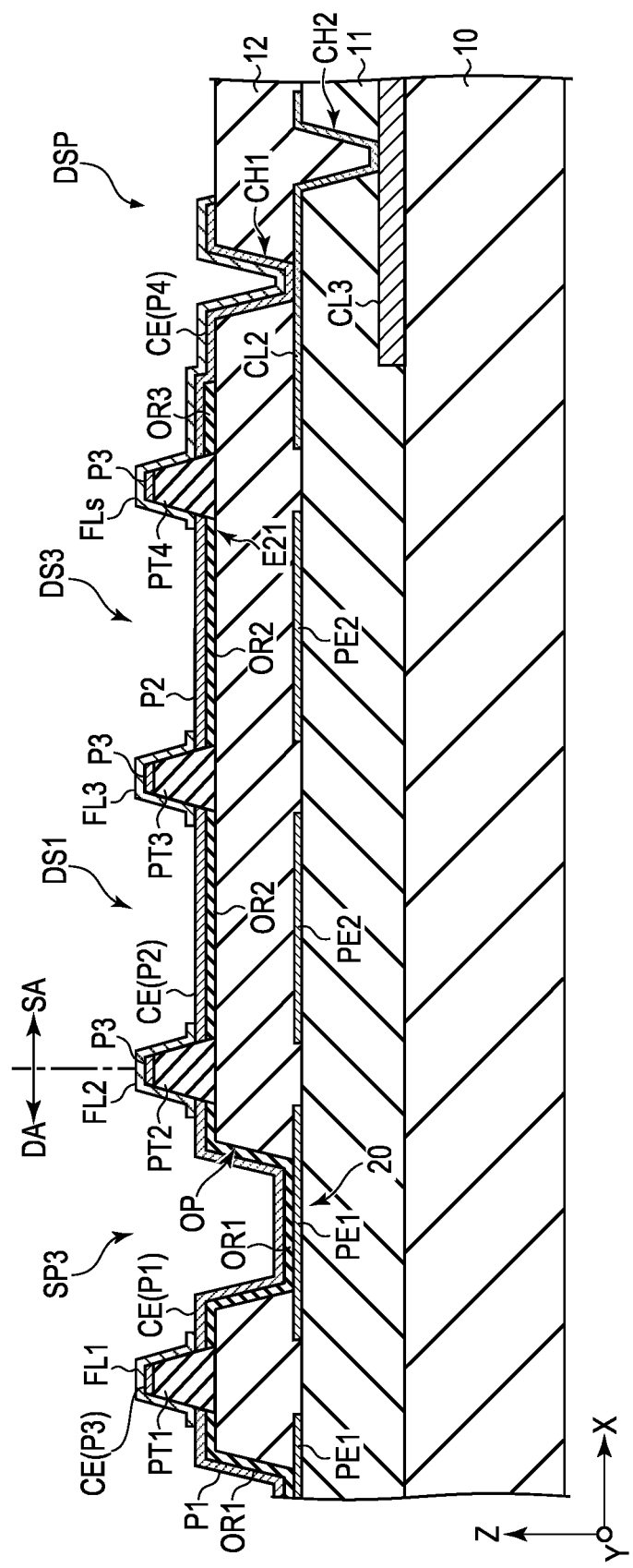
FIG. 12 is a schematic cross-sectional view of a display device according to the third embodiment.

FIG. 12 is a schematic cross-sectional view of a display device DSP of this embodiment. In this embodiment, a power feed line FL is disposed on each partition wall PT. The power feed line FL is formed of a metal material. In the following descriptions, the four power feed lines FL shown in FIG. 12 may be referred to as a power feed line FL1 (first power feed line), a power feed line FL2 (second power feed line), a power feed line FL3 (third power feed line) and a power feed lines FLs, in order from left to right.

The power feed line FL1 is disposed above the partition wall PT1. The power feed line FL2 is disposed above the partition wall PT2. The power supply line FL3 is disposed on the partition wall PT3. The power feed line FLs is located on the partition wall PT4. The power feed line FLs is wider than the power feed lines FL1, FL2 and FL3 and overlaps the contact hole CH1.

In the example shown in FIG. 12, the common electrode CE is divided by the partition walls PT1, PT2, PT3 and PT4. More specifically, the first portion P1, the second portion P2, the third portion P3 and the fourth portion P4 of the common electrode CE are separated from each other.

The power supply line FL1 is in contact with two first portions P1 located on respective sides of the partition wall PT1. The power feed line FL2 is in contact with the first portion P1 and the second portion P2 located on respective sides of the partition wall PT2. The power feed line FL3 is in contact with two second portions P2 located on respective sides of the partition wall PT3. The power feed line FLs is in contact with the second portion P2 and the fourth portion P4 located on respective sides of the partition wall PT4. The third portion P3 is located between the partition wall PT1 and the power feed line FL1, between the partition wall PT2 and the power feed line FL2, between the partition wall PT3 and the power feed line FL3, and between the partition wall PT4 and the power feed line FLs.

Figure 13:
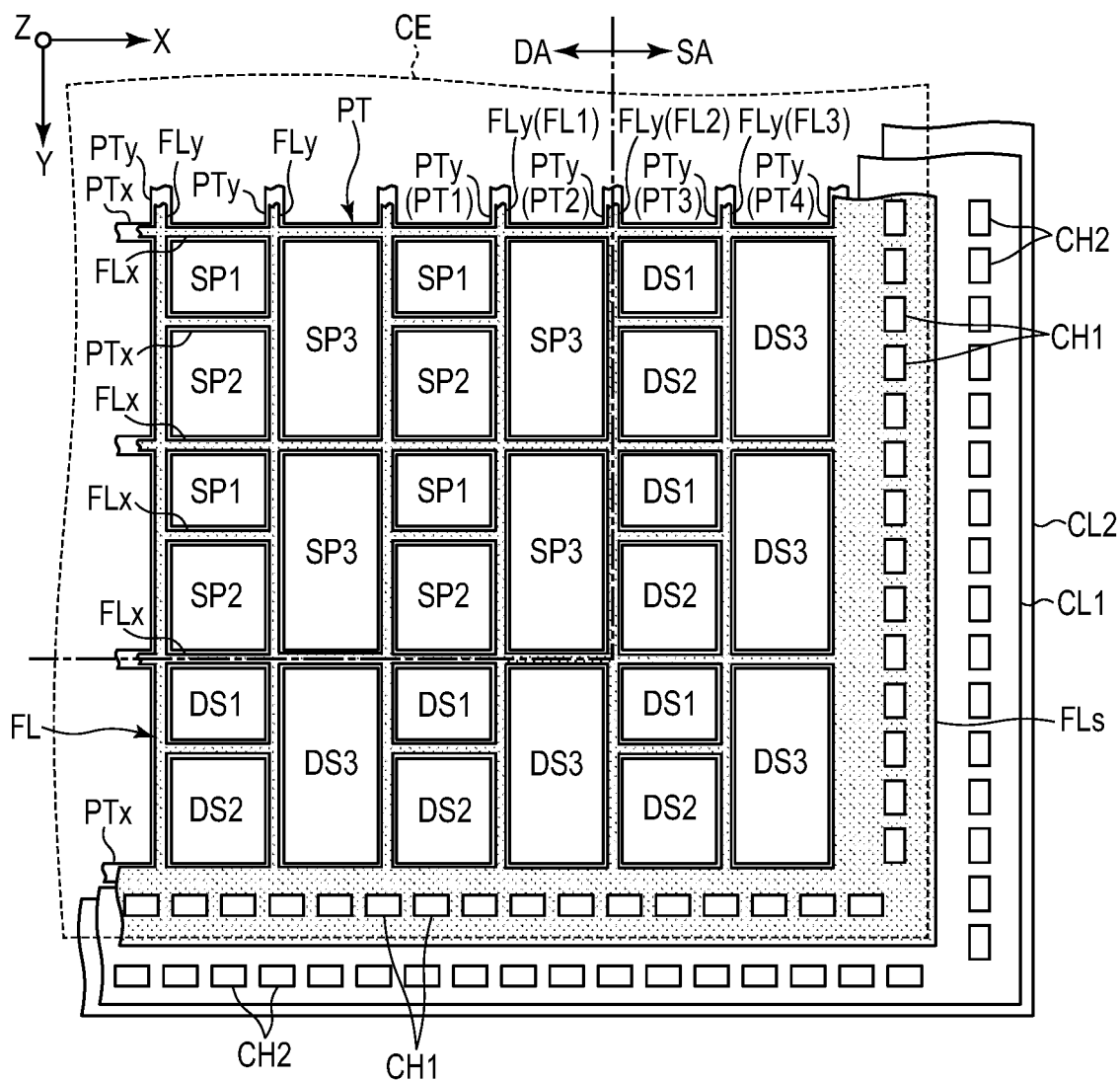
FIG. 13 is a schematic plan view of partition walls, power feed lines, a common electrode and a conductive layer shown in FIG. 12.

FIG. 13 is a schematic plan view of the partition walls PT, the power feed lines FL, the common electrode CE and the conductive layers CL1 and CL2. The shapes of the partition walls PT, the common electrode CE and the conductive layers CL1, CL2 are similar to those of the example shown in FIG. 7.

The power feed lines FL include power feed lines FLx extending along the first direction X and power feed lines FLy extending along the second direction Y. The power feed line FLx are respectively disposed above the partition walls PTx, and the power feed lines FLy are respectively disposed above the partition walls PTy. The power feed lines FL1, FL2 and FL3 shown in FIG. 12 are all power feed lines FLy. The power feed lines FLs are formed into a ring shape in the peripheral area SA. The end portions of the power feed lines FLx and FLy are connected to the power feed lines FLs.

Thus, in this embodiment, the metal-made power feed lines FLs are disposed in the area including the sub-pixels SP and the dummy sub-pixels DS. With this configuration, it possible to reduce the resistance of the common electrode CE. Further, even if the common electrode CE is divided at the locations of the partition walls PT as in the example shown in FIG. 12, the common voltage can be well supplied to the display element 20 of each sub-pixel SP by connecting the divided portions by the power feed lines FL.

In each of the above embodiments, the layout and configuration of the pixels PX and dummy pixels DP are not limited to those shown in FIGS. 1 and 2. For example, in each pixel PX, the sub-pixels SP (SP1, SP2 and SP3) of the same shape may be aligned along the first direction X. Similarly, in each dummy pixel DP, the dummy sub-pixels DS (DS1, DS2 and DS3) of the same shape may be aligned along the first direction X. In FIGS. 1 and 2, dummy pixels DP are arranged only one circumference around the display area DA, but they may be arranged two or more times.

Note that FIGS. 9, 10 and 11 each illustrate a case where the common electrode CE is formed of two layers, but the common electrode CE may be formed of three or more layers. If a single layer can be made thick, the common electrode CE may be formed thick, not from multiple layers.

In the configurations shown in FIGS. 3, 9, 10 and 11, the power feed lines FL shown in FIGS. 12 and 13 may be provided.

The second portions P2 disposed in the dummy sub-pixels DS may not be connected to the third portions P3 or the power supply lines FL, respectively. In this case, the second portions P2 may be floating.

In the configuration shown in FIG. 10, each of the third portion P3 may not include the first layer L1. Further, in the configuration shown in FIG. 11, the third portion P3 above the partition wall PT1 may not include the first layer L1. Further, in the configuration shown in FIG. 12, the third portion P3 may not be disposed between each partition wall PT and each respective power feed line FL.

Based on the display device which has been described in the above-described embodiments, a person having ordinary skill in the art may achieve a display device with an arbitral design change; however, as long as they fall within the scope and spirit of the present invention, such a display device shall be encompassed by the scope of the present invention.

A skilled person would conceive various changes and modifications of the present invention within the scope of the technical concept of the invention, and naturally, such changes and modifications are encompassed by the scope of the present invention. For example, if a skilled person adds/deletes/alters a structural element or design to/from/in the above-described embodiments, or adds/deletes/alters a step or a condition to/from/in the above-described embodiment, as long as they fall within the scope and spirit of the present invention, such addition, deletion, and altercation are encompassed by the scope of the present invention.

Further, regarding the present embodiments, any advantage and effect those will be obvious from the description of the specification or arbitrarily conceived by a skilled person are naturally considered achievable by the present invention.

What is claimed is:
1. A display device comprising:
   a base;
   a first insulating layer disposed on the base;
   a first pixel electrode disposed on the first insulating layer in a pixel located in a display area;
   a second pixel electrode disposed on the first insulating layer in a dummy pixel located in a peripheral area on an outer side of the display area;
   a second insulating layer disposed on the first insulating layer and comprising an opening overlapping the first pixel electrode;
   a first organic layer disposed in the pixel and in contact with the first pixel electrode via the opening;
   a second organic layer disposed in the dummy pixel;
   a partition wall disposed on the second insulating layer and between the first organic layer and the second organic layer; and
   a common electrode covering the first organic layer, the second organic layer and the partition wall,
   wherein
   an end portion of the first organic layer is in contact with a side surface of the partition wall.
2. The display device of claim 1, wherein
   the partition wall has such a shape that a width of an upper portion is less than a width of a lower portion.
3. The display device of claim 1, wherein
   the common electrode includes a first portion covering the first organic layer, a second portion covering the second organic layer, and a third portion covering the partition wall, and the third portion is connected to the first portion and the second portion.

4. The display device of claim 3, wherein the common electrode comprises a first layer covering the first organic layer and the partition wall, and a second layer covering the first layer.

5. The display device of claim 4, wherein the first layer in the first portion and the first layer in the third portion are separated from each other, and the second layer in the first portion and the second layer in the third portion are connected to each other.

6. The display device of claim 4, wherein the second portion includes the second layer and does not include the first layer.

7. The display device of claim 3, wherein a thickness of the first portion is greater than a thickness of the second portion.

8. The display device of claim 1, further comprising: a power feed line disposed on the partition wall, wherein
the common electrode includes a first portion covering the first organic layer and a second portion covering the second organic layer, and
the power feed line is in contact with the first portion and the second portion.

9. The display device of claim 8, wherein the common electrode further comprises a third portion covering the partition wall, and
the third portion is located between the partition wall and the power feed line, and is separated from the first portion and the second portion.

10. The display device of claim 1, wherein the second pixel electrode and the second organic layer oppose each other via the second insulating layer.

11. A display device comprising:
a base;
a first insulating layer disposed on the base;
a first pixel electrode disposed on the first insulating layer in a pixel located in a display area;
a second pixel electrode disposed on the first insulating layer in a dummy pixel located in a peripheral area on an outer side of the display area;
a second insulating layer disposed on the first insulating layer and comprising an opening overlapping the first pixel electrode;
a first organic layer disposed in the pixel and in contact with the first pixel electrode via the opening;
a second organic layer disposed in the dummy pixel;
a partition wall disposed on the second insulating layer and between the first organic layer and the second organic layer;
a common electrode covering the first organic layer, the second organic layer and the partition wall; and
a first conductive layer located between the first insulating layer and the second insulating layer,
wherein
an end portion of the first organic layer is in contact with a side surface of the partition wall,
the second insulating layer comprises a first contact hole in the peripheral area,
the common electrode includes a fourth portion in the peripheral area, and
the fourth portion is in contact with the first conductive layer via the first contact hole.

12. The display device of claim 11, further comprising:
a third organic layer disposed on the second insulating layer and covered by the fourth portion.

13. The display device of claim 12, wherein the third organic layer is formed into a ring shape in the peripheral area.

14. The display device of claim 12, wherein the dummy pixel is located between the display area and the third organic layer.

15. The display device of claim 11, wherein the first conductive layer is formed into a ring shape in the peripheral area.

16. The display device of claim 11, wherein the dummy pixel is located between the display area and the first conductive layer in planar view.

17. The display device of claim 11, further comprising:
a second conductive layer located between the base and the first insulating layer,
wherein
the first insulating layer comprises a second contact hole in the peripheral area, and
the first conductive layer is in contact with the second conductive layer via the second contact hole.

18. The display device of claim 17, wherein the second conductive layer is formed into a ring shape in the peripheral area.

19. The display device of claim 17, wherein the dummy pixel is located between the display area and the second conductive layer in planar view.

20. The display device of claim 17, wherein an edge of the common electrode is located between the first contact hole and the second contact hole in planar view.

* * * * *